United States Patent
Ito et al.

(10) Patent No.: US 6,372,369 B1
(45) Date of Patent: Apr. 16, 2002

(54) HARD FILM, SLIDING MEMBER COVERED WITH HARD FILM, AND MANUFACTURING METHOD THEREOF

(75) Inventors: Naoki Ito, Okaya; Shoji Tanaka, Shiojiri, both of (JP)

(73) Assignee: Teikoku Piston Ring Co., Ltd., Tokyo (JP)

( * ) Notice: Subject to any disclaimer, the term of this patent is extended or adjusted under 35 U.S.C. 154(b) by 0 days.

(21) Appl. No.: 09/661,410

(22) Filed: Sep. 13, 2000

(30) Foreign Application Priority Data

Sep. 24, 1999 (JP) .......................................... 11-270153

(51) Int. Cl.$^7$ ............................ F16J 9/26; C23C 26/00
(52) U.S. Cl. ............... 428/698; 277/235 A; 277/235 R; 106/286.1; 427/523; 428/336
(58) Field of Search ..................... 277/235 A, 235 R, 277/236; 428/698, 336; 106/286.1; 427/523

(56) References Cited

U.S. PATENT DOCUMENTS

| | | | | |
|---|---|---|---|---|
| 5,316,321 A | * | 5/1994 | Ishida et al. | 277/235 |
| 5,449,547 A | * | 9/1995 | Miyazaki et al. | 428/698 |
| 5,549,086 A | * | 8/1996 | Ozawa et al. | 123/193.6 |
| 5,743,536 A | * | 4/1998 | Komuro et al. | 277/235 |
| 6,060,182 A | * | 5/2000 | Tanaka et al. | 428/698 |

OTHER PUBLICATIONS

English abstract of CN 1102693 published May 17, 1995.*
English abstract of JP 03247766 published Nov. 5, 1991.*

* cited by examiner

Primary Examiner—Archene Turner
(74) Attorney, Agent, or Firm—Armstrong, Westerman & Hattori, LLP

(57) ABSTRACT

A nitrided layer is formed on a piston ring and a hard film is formed by arc ion plating on the nitrided layer at the outer circumferential surface. The hard film has a crystal structure comprised of mixed phases of CrN and TiN, and contains oxygen in a solid solution state in the CrN and TiN crystals. The hard film comprises chromium of 40 to 75 percent by weight, titanium of 10 to 40 percent by weight, oxygen of 0.5 to 15 percent by weight, and the remainder of nitrogen. The crystal particle size is within 1 μm. The Vickers hardness of the hard film is in a range of 1300 to 2300. The crystals of CrN and TiN have a preferred orientation of (200) surface or preferred orientation of (111) surface parallel to a surface being covered, and has a columnar structure developing in a columnar shape from the base material toward the film surface. Carbon in a solid solution state may be contained instead of oxygen, and both oxygen and carbon may be contained in a solid solution state. An under film of CrN may be formed between the nitrided layer and the hard film.

9 Claims, 7 Drawing Sheets

HARD FILM, SLIDING MEMBER COVERED WITH HARD FILM, AND MANUFACTURING METHOD THEREOF

BACKGROUND OF THE INVENTION

1. Field of the Invention

The present invention relates to a hard film with improved sliding characteristics and in particular having improved resistance to peeling ("peeling" as used hereafter indicates that a portion of the surface of the film peels off.), and is effective on sliding surfaces of sliding members such as piston rings in internal combustion engines.

2. Description of the Related Art

Piston rings have been exposed to ever harsher operating conditions in recent years, due to higher engine output and compliance with exhaust emission regulations. Hard films utilizing physical vapor deposition such as a TiN film, a CrN film, a hard film containing oxygen in a solid solution state in a crystal structure of CrN (Japanese Patent Laid-open No. 6-265023), or a hard film containing carbon in a solid solution state in a crystal structure of CrN (Japanese Patent Laid-open No. 6-300130) have been proposed as countermeasures to cope with these harsh operating conditions. A hard film containing oxygen or carbon, or both oxygen and carbon in a solid solution state in a crystal structure of CrN and $MO_2N$ has further been proposed (Japanese Patent Laid-open No. 11-1763). A hard film of Cr—Ti—N—O alloy (Japanese Patent Laid-open No. 6-346077) and a hard film of Ti—Cr—N—O alloy (Japanese Patent Laid-open No. 6-346076) have also been proposed.

The above Japanese Patent Laid-open No. 6-346076 discloses a sliding member coated with a physical vapor deposition film comprised of titanium, a group of M (Cr, V, Zr, Nb, Mo, Hf, Ta, W and/or Al), nitrogen, and oxygen, in an atomic ratio of M/(Ti+M)=1 to 45%, O/(N+O)=5 to 80%. The above Japanese Patent Laid-open No. 6-346077 discloses a sliding member coated with a physical vapor deposition film comprised of chromium, a group of M (Ti, V, Zr, Nb, Mo, Hf, Ta, W and/or Al), nitrogen, and oxygen, in an atomic ratio of M/(Cr+M)=1 to 55%, O/(N+O)=5 to 80%.

Since the physical vapor deposition films of these inventions contain at least four types of elements, three independent composition formulae must be shown to define the composition range. However, the above two official gazettes show only two composition formulae. The ranges of absolute values for Ti, M or Cr are therefore not shown. Further, various configurations are possible for structures in the film comprised of titanium, a group of M (Cr, V, Zr, Nb, Mo, Hf, Ta, W and/or Al), nitrogen, and oxygen, in an atomic ratio of M/(Ti+M)=1 to 45%, O/(N+O)=5 to 80%, and also in the film comprised of chromium, a group of M (Ti, V, Zr, Nb, Mo, Hf, Ta, W and/or Al), nitrogen, and oxygen, in an atomic ratio of M/(Cr+M)=1 to 55%, O/(N+O)=5 to 80%. However, nothing is mentioned of these various configurations possible in the above two official gazettes.

The various types of technology have been proposed as described above. However, when the above physical vapor deposition films are subjected under harsh engine operating conditions to excessive repetitive strain due to sliding movement on their surfaces during use, cracks appear. These cracks develop in size and cause the problem of peeling to occur within the physical vapor deposition film.

SUMMARY OF THE INVENTION

In view of the above problems, the present invention has the object of providing a hard film with superior sliding characteristics and in particular having improved resistance to peeling.

The hard film of the present invention has a crystal structure comprised of mixed phases of CrN and TiN, and contains oxygen in a solid solution state in the CrN and TiN crystals. The hard film comprises chromium of 40 to 75 percent by weight, titanium of 10 to 40 percent by weight, oxygen of 0.5 to 15 percent by weight, and the remainder of nitrogen. The crystal particle size is less than 1 μm.

The resistance to peeling deteriorates when the chromium content is below 40 percent by weight or exceeds 75 percent by weight. The resistance to peeling also deteriorates when the titanium is below 10 percent by weight or in excess of 40 percent by weight. The resistance to peeling also deteriorates when the oxygen content is below 0.5 percent by weight or in excess of 15 percent by weight.

The adhesion and the resistance to peeling in the film deteriorate when the crystal particle size is more than 1 μm. A crystal particle size within 0.1 μm is preferable.

Carbon may be used instead of oxygen in the above hard film, and may be contained in a solid solution state in a content of 0.5 to 10 percent by weight. The resistance to peeling deteriorates when the carbon content is lower than 0.5 percent by weight or in excess of 10 percent by weight.

Both oxygen and carbon may be contained in a solid solution state. In such a case, the oxygen content is 0.5 to 15 percent by weight, the carbon content is 0.5 to 10 percent by weight, and the total content of oxygen and carbon is within 20 percent by weight. The resistance to peeling deteriorates when the total oxygen and carbon content exceeds 20 percent by weight.

The hard film has preferably a Vickers hardness in a range of 1300 to 2300. The resistance to wear deteriorates when the Vickers hardness is less than 1300 and the adhesion deteriorates when the Vickers hardness exceeds 2300.

The sliding member of the present invention is covered on at least the sliding surfaces by the hard film. A piston ring for example covered with the above-mentioned hard film therefore has satisfactory sliding characteristics and in particular resistance to peeling under harsh operating conditions. The application of the hard film may be performed by ion plating.

In order to provide good adhesion, the sliding member has preferably an under film beneath the hard film. The under film is comprised of CrN not substantially containing oxygen and carbon in a solid solution state.

In order to provide good resistance to peeling, the crystals of CrN and TiN have preferably a preferred orientation of (200) surface or preferred orientation of (111) surface parallel to a surface being covered.

In order to provide good adhesion, the crystals of CrN and TiN have preferably a columnar structure developing in a columnar shape from the base material toward the film surface.

The thickness of the hard film is preferably in a range from 1 to 100 μm.

BRIEF DESCRIPTION OF THE DRAWINGS

The aforesaid and other objects and features of the present invention will become more apparent from the following detailed description and the accompanying drawings.

FIG. 3(a) and FIG. 3(b) show a pin-on-cylinder friction testing machine.

DESCRIPTION OF THE PREFERRED EMBODIMENTS

Figure 1A:
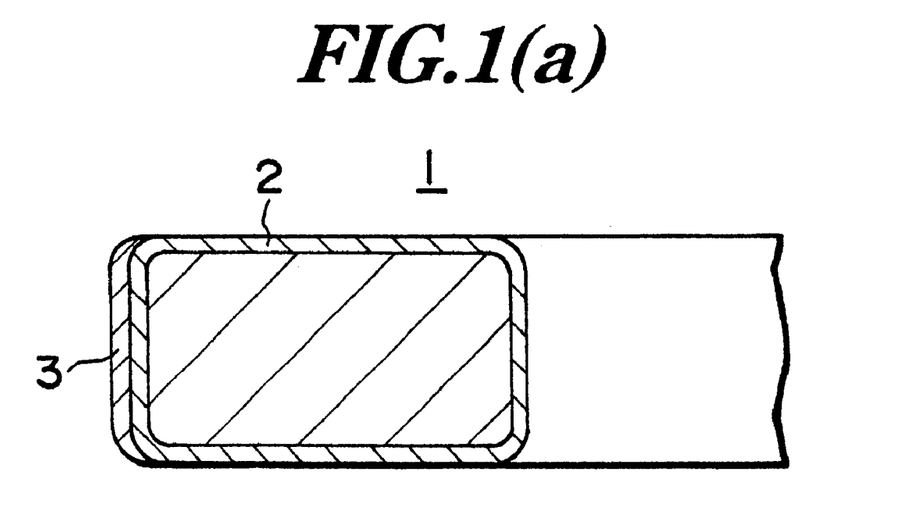
FIGS. 1(a) and 1(b) are respectively vertical cross sectional views of a portion of the piston rings of the embodiments of the present invention.

FIG. 1(a) is a vertical cross sectional view of a portion of the piston ring of one preferred embodiment of the present invention.

A piston ring 1 of this embodiment is a ring with a rectangular cross section formed from steel, cast iron, titanium or a titanium alloy, etc. A nitrided layer 2 with a Vickers hardness of 700 or more is formed over the entire circumferential surface of the piston ring 1. A hard film 3 is formed by arc ion plating on the nitrided layer 2 at the outer circumferential surface.

The hard film 3 has a crystal structure comprised of mixed phases of CrN and TiN, and contains oxygen in a solid solution state in the CrN and TiN crystals. The hard film 3 is comprised of chromium of 40 to 75 percent by weight, titanium of 10 to 40 percent by weight, oxygen of 0.5 to 15 percent by weight and the remainder of nitrogen. The crystal particle size is within 1 $\mu$m. The Vickers hardness of the hard film 3 is in a range of 1300 to 2300 and the film thickness is 1 to 100 $\mu$m. The crystals of CrN and TiN have a preferred orientation of (200) surface or preferred orientation of (111) surface parallel to a surface being covered and has a columnar structure developing in a columnar shape from the base material toward the film surface.

Figure 1B:
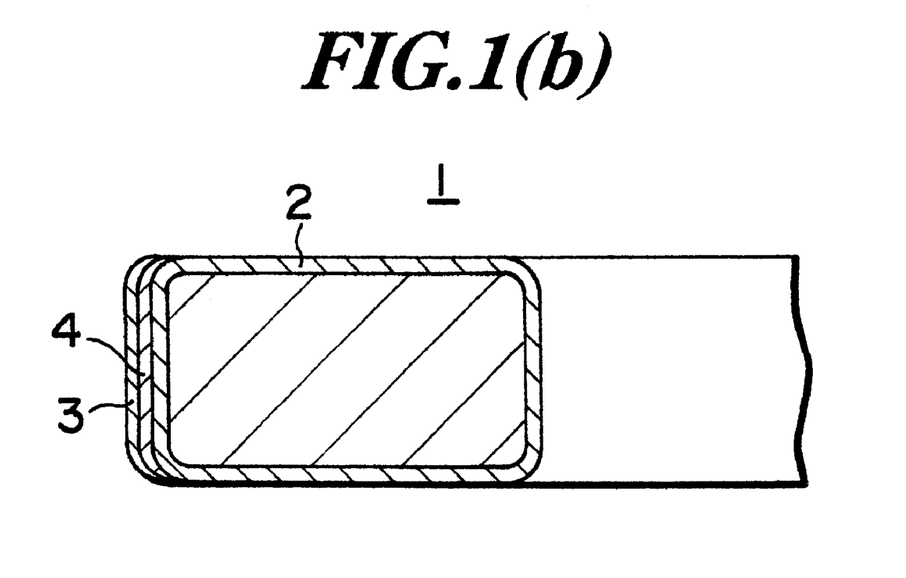

FIG. 1(b) is a vertical cross sectional view of a portion of the piston ring of another preferred embodiment of the present invention.

A piston ring 1 of this embodiment has an under film 4 of CrN not substantially containing oxygen and carbon in a solid solution state, formed between the nitrided layer 2 and the hard film 3 of the piston ring 1 of the above-mentioned embodiment. Other structural elements are the same as the piston ring of the above-mentioned embodiment.

In the above two embodiments, instead of oxygen, carbon may be contained in a ratio of 0.5 to 10 percent by weight in a solid solution state in the hard film 3. Further, both oxygen and carbon may be contained in a solid solution state. In such a case, the oxygen content is 0.5 to 15 percent by weight, the carbon content is 0.5 to 10 percent by weight, and the total content of oxygen and carbon is within 20 percent by weight.

The manufacturing method for the above-mentioned piston ring 1 is described next.

The nitrided layer 2 is formed by a method such as gas nitriding or salt bath nitriding.

The hard film 3 is formed by an arc ion plating method. The basic configuration of the arc ion plating apparatus will be described in reference to FIG. 2. A cathode 11 made from evaporative material and a substrate 12 are installed in a vacuum chamber 10. The cathode 11 is connected to an arc supply source 13 installed outside the vacuum chamber 10. An anode not shown in the figure is connected to the arc supply source 13. A negative bias voltage is applied to the substrate 12 by means of a bias voltage supply source 14. The vacuum chamber 10 is provided with a gas inlet 15 connected to a process gas supply source and an exhaust outlet 16 connected to a pump.

Figure 2:
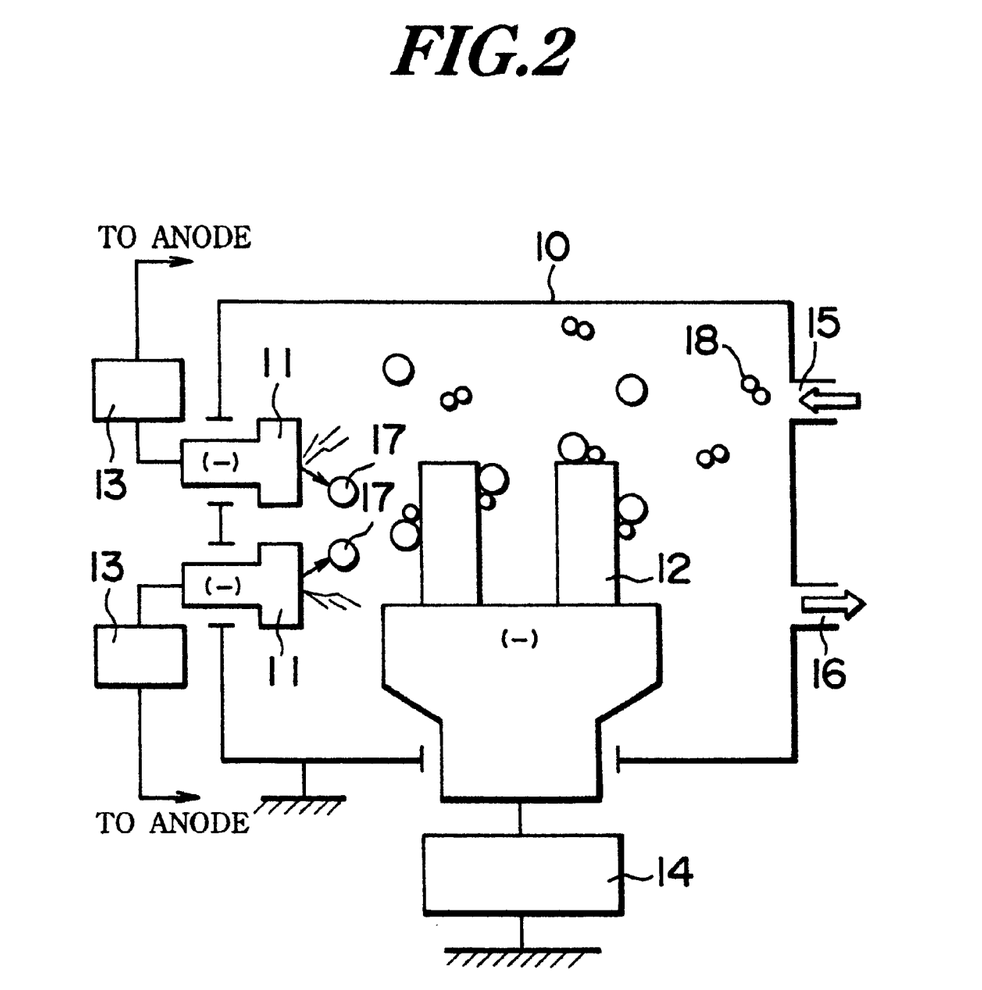
FIG. 2 is a drawing showing the structure of the arc ion plating apparatus.

In the above-mentioned arc ion plating apparatus, a cathode of chromium metal and a cathode of titanium metal, or a cathode of chromium-titanium alloy is installed in the vacuum chamber 10. Gases used in the process are nitrogen gas as the source of nitrogen and oxygen gas as the source of oxygen. In this process, a hard film containing oxygen in a solid solution state in crystals of CrN and TiN can be coated on the substrate 12. In FIG. 2, the reference numeral 17 denotes metallic ions generated by evaporation and ionization of the material of the cathode 11. The reference numeral 18 denotes reactive gas molecules. The amount of the arc electrical current for each cathode can be adjusted separately.

In the above process, constituent amounts of chromium and titanium can be adjusted by regulating the arc electrical current in the cathode of chromium metal and cathode of titanium metal, or the cathode of chromium-titanium alloy. The constituent amounts may also be adjusted by changing the percentage of chromium and titanium in the cathode of chromium-titanium alloy.

The hard film containing carbon in a solid solution state instead of oxygen can be coated by changing the above-mentioned process gas from oxygen gas to $CH_4$ gas, $C_2H_4$ gas or $C_2H_2$ gas as the carbon source. Further, the hard film containing both oxygen and carbon in a solid solution state can be coated by using oxygen gas along with $CH_4$ gas, $C_2H_4$ gas or $C_2H_2$ gas as the process gases.

The oxygen concentration can be controlled by regulating the partial pressure from the oxygen source during ion plating. Increasing the partial pressure from the oxygen source raises the oxygen concentration. Similarly, the carbon concentration can be controlled by regulating the partial pressure from the carbon source during ion plating. Increasing the partial pressure from the carbon source raises the carbon concentration.

The hardness of the film can be controlled by regulating the bias voltage. The hardness increases as the bias voltage is increased.

The method for covering the piston ring with the hard film is described next.

The piston rings were ultrasonically washed in acetone and set inside the furnace of the arc ion plating apparatus and a vacuum was produced. The pressure inside the furnace was reduced below $1\times10^{-3}$ Pa and the piston rings were then heated to 473 to 773K. The furnace internal pressure rose temporarily due to the heating. After the pressure was again lowered below $5\times10^{-3}$ Pa by reduction of the pressure, a bias voltage of −800 to −1000 volts was applied, and an arc discharge was caused between the cathode and anode. Nitrogen gas was then supplied into the furnace and metal ion bombardment was performed. The bias voltage was then set to −20 to −100 volts, and an under film of CrN not substantially containing oxygen in a solid solution state, was formed on the outer circumferential surface of the piston ring at a pressure of $5\times10^{-1}$ to 2.0 Pa. Next, the total pressure was adjusted to be $5\times10^{-1}$ to 2.0 Pa, in a nitrogen gas and oxygen gas atmosphere at a gas partial pressure ratio of 1:(0.01 to 0.25) inside the furnace, and ion plating continued at a bias voltage of −20 to −100 volts. The hard film containing oxygen in a solid solution state in the CrN and TiN crystals was thus formed on the under film.

The process to form the under film is eliminated from the above process when not forming the under film of the CrN.

When the oxygen partial pressure inside the ion plating furnace is high, the oxygen content contained in the crystals of CrN and TiN in a solid solution state increases, and when the oxygen partial pressure is low, the oxygen content decreases. The hardness of the film can be controlled by thus increasing or reducing the bias voltage, total pressure or oxygen content. The film hardness increases when the bias voltage is high or total pressure is low, or the oxygen content is increased. The film acquires a columnar structure when the bias voltage is made low. The film acquires a columnar structure when the pressure inside the furnace is made high.

The deposition of crystal structures is controlled by regulating the arc electrical current and the nitrogen partial pressure. The $Cr_2N$, Cr or Ti deposits when the nitrogen partial pressure is low relative to the arc electrical current.

The hard film peeling resistance test is described next.

The peeling resistance test was performed by using the pin-on-cylinder friction testing machine. A summary of the test is described while referring to FIG. 3(a) and FIG. 3(b).

Figure 3A:
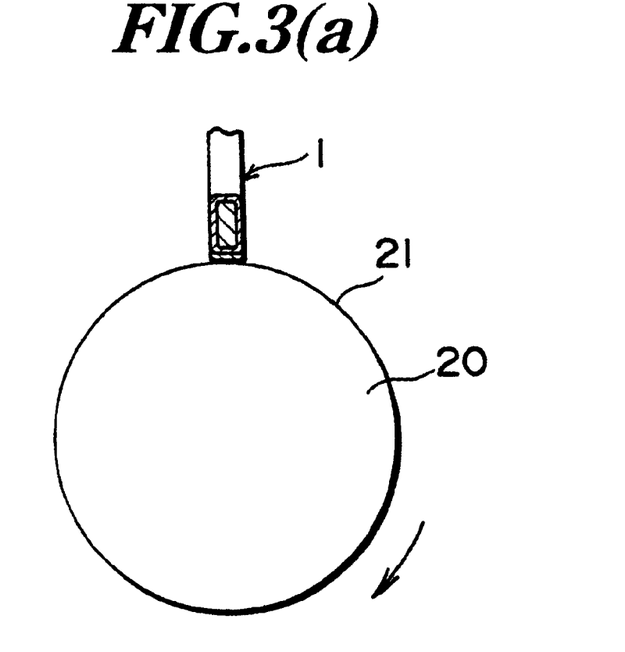
FIG. 3(a) is a front elevational view partly in section.
Figure 3B:
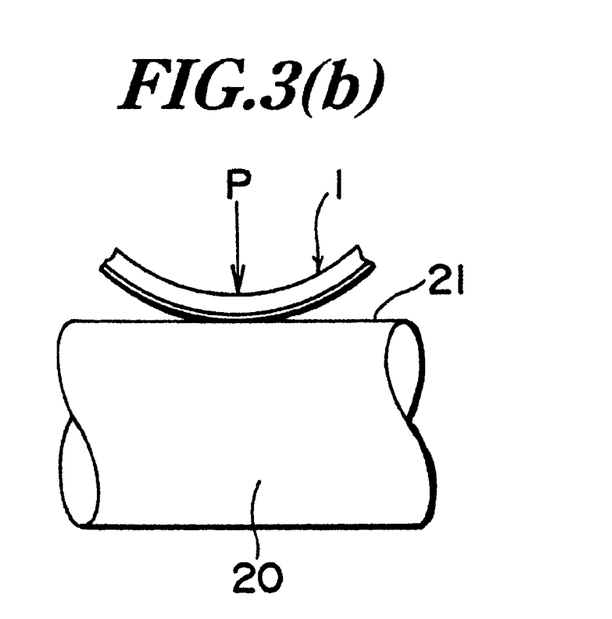
FIG. 3(b) is a side elevational view.
Figure 5:
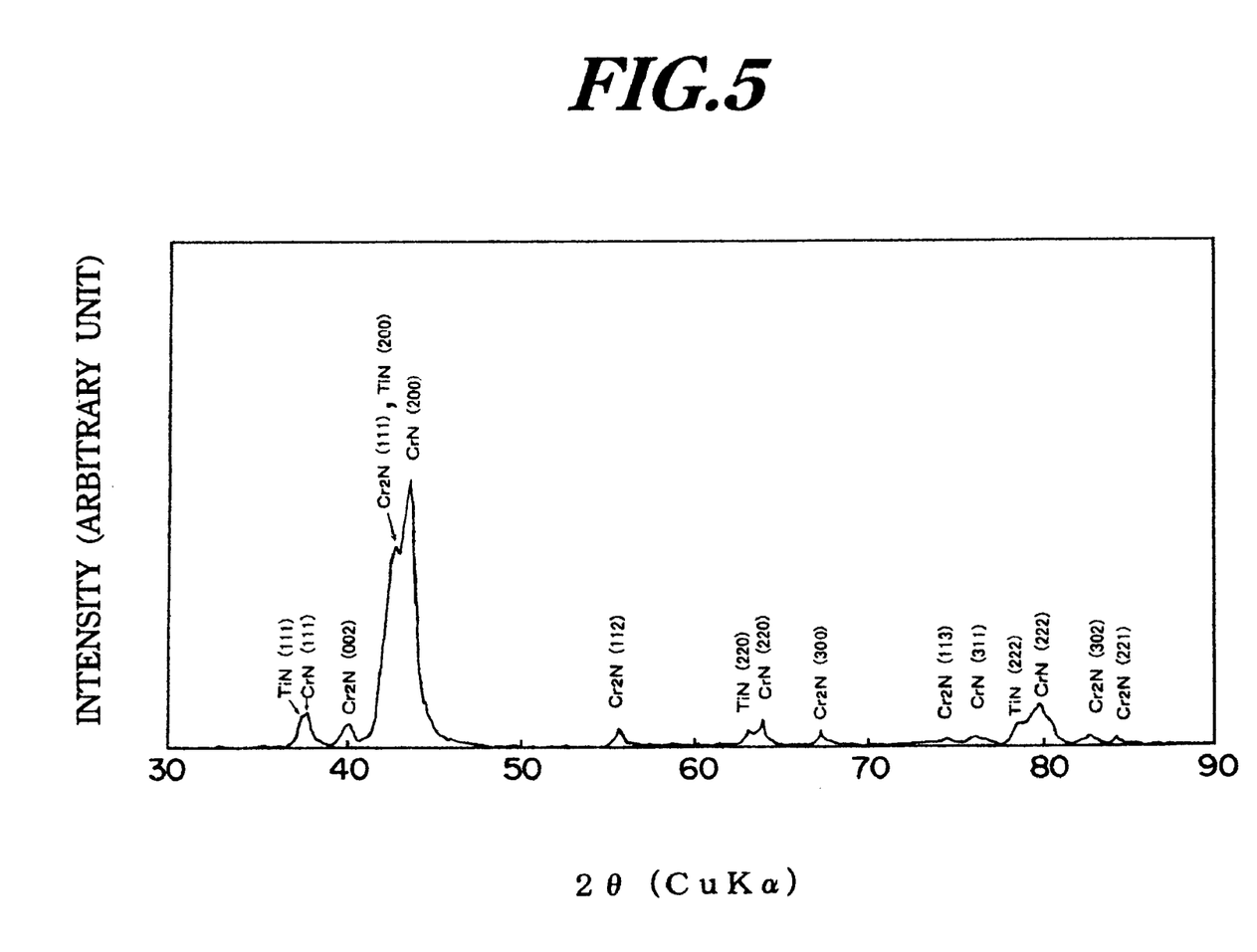
FIG. 5 is an X-ray diffraction pattern of the hard film of the first comparative example.

The piston ring 1 is placed on the outer circumferential surface 21 of a rotor 20 which is rotated around a horizontal axis. A load P is applied to the piston ring 1 and the outer circumferential surface of the piston ring 1 is pressed onto the rotor 20. In this state, the rotor 20 is rotated at a fixed speed while lubricating oil is supplied to the contact point of the piston ring 1 with the rotor 20. The test is performed while varying the load P on the piston ring 1. The load P is measured when peeling occurs on the hard film 3 of the piston ring 1. The test conditions were as follows.

diffraction pattern of the hard film of the first comparative example. This pattern shows that TiN, CrN, and $Cr_2N$ crystals are mixed in the hard film of the first comparative example.

| (2) Rotor | |
|---|---|
| Material | Cast iron (equivalent to JIS FC250) |
| Surface | Mirror finish |

(3) Lubricating oil
   Nisseki Hi Diesel S3 10W engine oil (4) Load
   Range from 30N to 250N
   An initial load of 30N was applied for 1 minute and if not peeling occurred, the test was continued while increasing the load in steps of 10N each. The test was continued until peeling occurred or the test load reached 250N.

(5) Time
   Each load was applied for 1 minute.

(6) Speed
   3 meters per second (7) Temperature
   Room temperature

TABLE 1

| | No. | Crystal Structure | Content (Percent by weight) | | | | | Ti/(Ti + Cr) Atomic Percent | O/(N + O) Atomic Percent | Vickers Hardness |
|---|---|---|---|---|---|---|---|---|---|---|
| | | | Cr | Ti | O | C | O + C | | | |
| Comparative Example | 1 | CrN + $Cr_2N$ + TiN | 62 | 19 | 4.8 | 0 | 4.8 | 25.0 | 22.8 | 2150 |
| | 2 | $Cr_2N$ + Ti + TiN | 45 | 39 | 0 | 7.2 | 7.2 | 48.5 | 0.0 | 1870 |
| | 3 | Cr + $Cr_2N$ + TiN | 75 | 12 | 2.5 | 1.1 | 3.6 | 14.8 | 18.9 | 1720 |
| | 4 | CrN + $Cr_2N$ + Ti + TiN | 41 | 40 | 3.4 | 1.9 | 5.3 | 51.4 | 17.8 | 1640 |
| | 5 | CrN + Ti + TiN | 45 | 39 | 5.7 | 0 | 5.7 | 48.5 | 32.6 | 1510 |
| Embodiment | 1 | CrN + TiN | 54 | 19 | 9.3 | 0 | 9.3 | 27.6 | 31.5 | 1930 |
| | 2 | CrN + TiN | 65 | 12 | 0 | 1.4 | 1.4 | 16.7 | 0.0 | 2010 |
| | 3 | CrN + TiN | 41 | 32 | 1.3 | 0.8 | 2.1 | 45.9 | 4.4 | 1550 |
| | 4 | CrN + TiN | 50 | 17 | 4.9 | 7.2 | 12.1 | 27.0 | 17.0 | 1840 |
| | 5 | CrN + TiN | 62 | 14 | 3.1 | 0 | 3.1 | 19.7 | 11.5 | 1420 |

(1) Test piece (piston ring)

| Material | 17 Cr martensitic steel |
|---|---|
| Under processing | Nitriding |
| Hard film thickness | 50 μm |
| Surface roughness | 0.6 $\mu m R_z$ |

Figure 4:
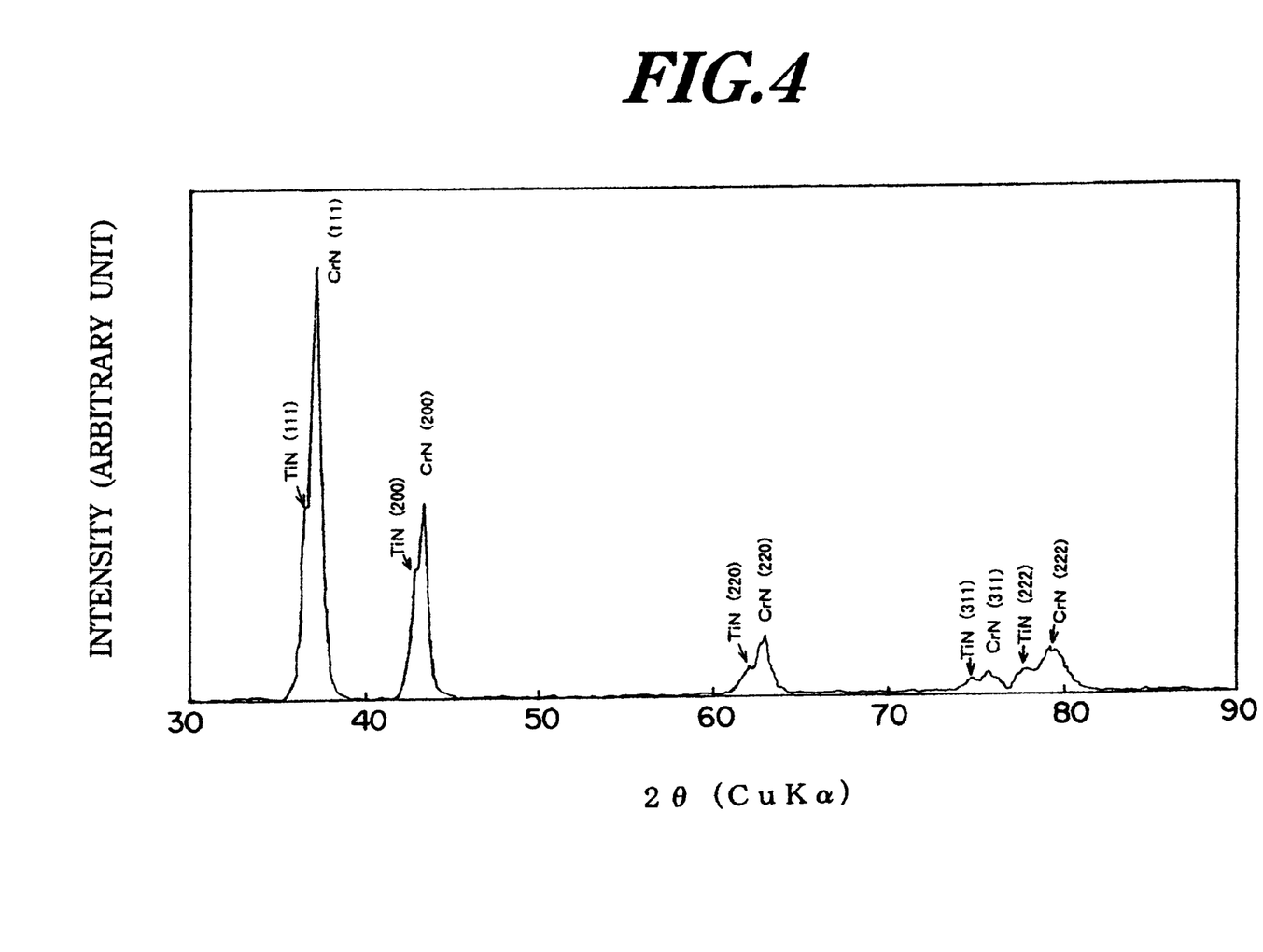
FIG. 4 is an X-ray diffraction pattern of the hard film of the first embodiment.
Figure 6:
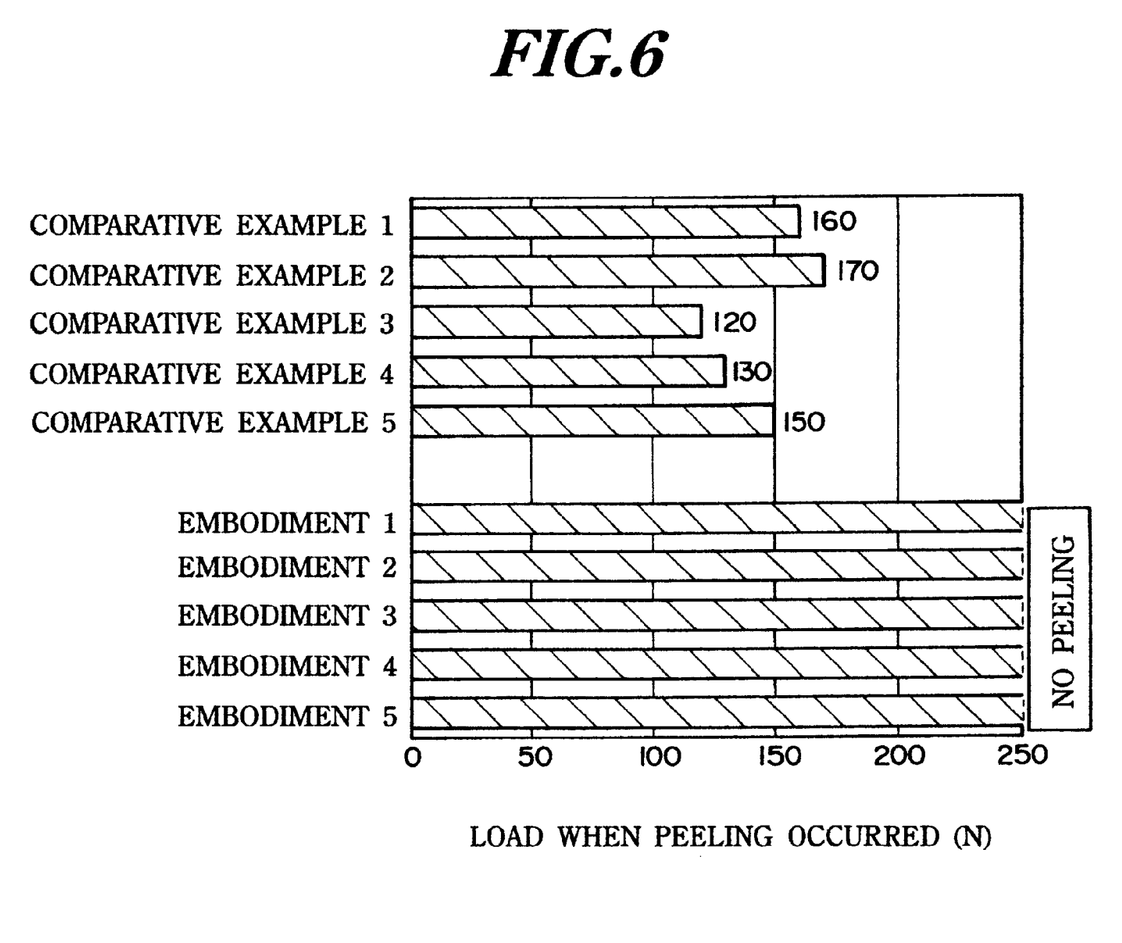
FIG. 6 is a graph showing the results of the peeling resistance test.

FIG. 4 is an X-ray diffraction pattern of the hard film of the first embodiment. The diffraction peaks (111) and the diffraction peaks (200) in the TiN and CrN nearly overlap because of the minute size of the crystal particle and the close lattice constants. A close look however shows that diffraction rays of the peaks are present and that the TiN and CrN crystals are mixed in the hard film of the first embodiment. FIG. 4 also shows that the relative strength of the diffraction rays (111) in the TiN and CrN is larger than that of the hard film not having a preferred orientation and that preferred orientations of (111) are present. FIG. 5 is an X-ray the test results are shown in FIG. 6. Peeling occurred in the hard film of the comparative examples 1 through 5 at test loads of 170N or less. In the hard film of the embodiments 1 through 5 on the other hand, the resistance to peeling was excellent, with no peeling occurring even at a test load of 250N.

Figure 7A:
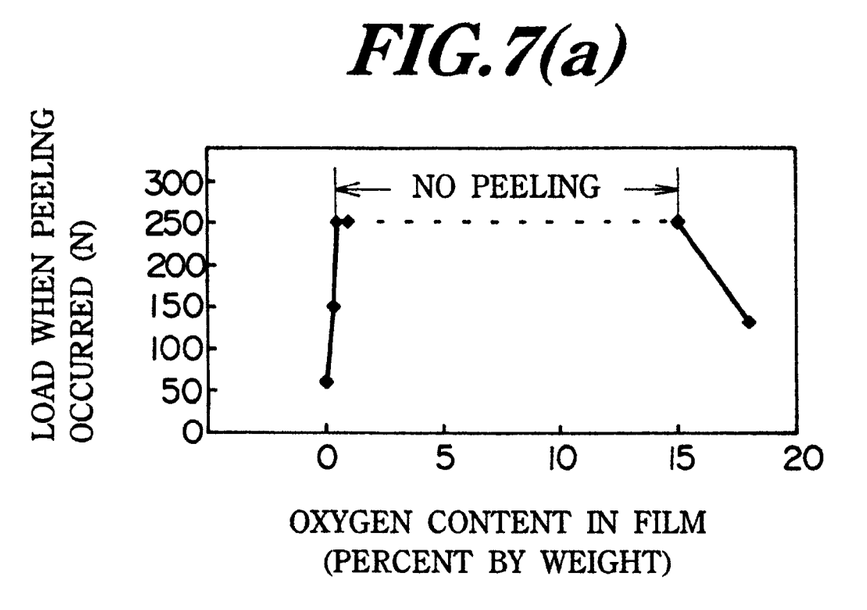
FIG. 7(a) is a graph showing the results of the peeling resistance test when the amount of oxygen is varied.
Figure 7B:
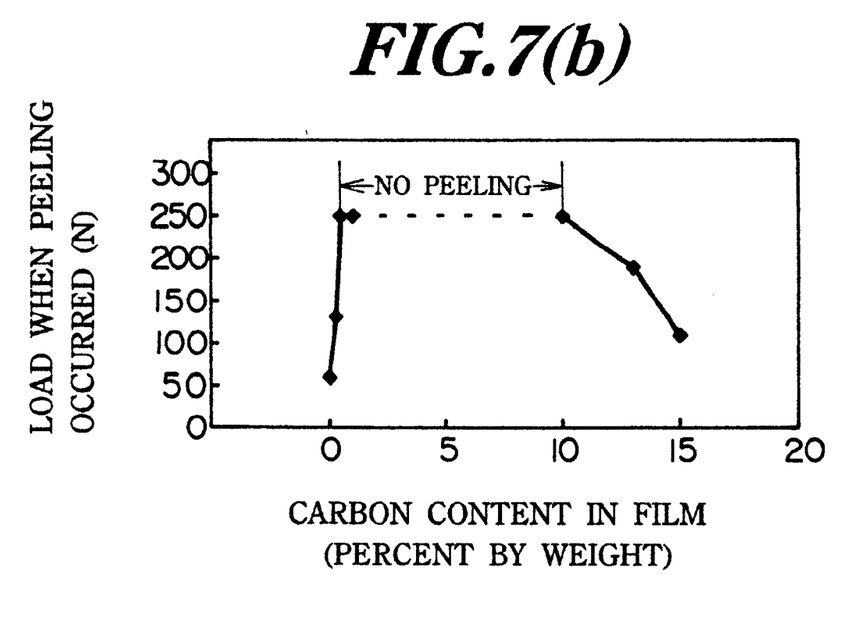
FIG. 7(b) is a graph showing the results of the peeling resistance test when the amount of carbon is varied.

Next, friction test results obtained with the pin-on-cylinder friction testing machine, from changing the carbon content or oxygen content in the hard film of the embodiment are shown in FIG. 7(a) and FIG. 7(b).

FIG. 7(a) shows friction test results obtained with the pin-on-cylinder friction testing machine when the oxygen content was changed. No peeling occurred even at a test load of 250N, with the oxygen content in a range from 0.5 to 15 percent by weight.

FIG. 7(b) shows friction test results obtained with the pin-on-cylinder friction testing machine when the carbon content was changed. No peeling occurred even at a test load of 250N, with the carbon content in a range from 0.5 to 10 percent by weight.

Next, engine tests were performed. The outer circumferential surfaces of the top rings were respectively covered with the hard films of the embodiments 1 through 3 and the hard film of the comparative example 2 that was subjected to the highest load among the comparative examples used in the previously described peeling resistance test.

The engine and test conditions were as follows. Engine: 94 mm bore, 4 cylinder, 4 stroke diesel engine Test conditions: Full load, 300 hours Results from observations of the top ring outer circumferential surface after engine operation are shown in Table 2. Peeling occurred in the hard film of the comparative example 2, but no peeling occurred in the hard films of the embodiments 1 through 3.

TABLE 2

|  | No. | Hard Film Status of Top Ring Outer Circumferential Surface |
|---|---|---|
| Embodiment | 1 | No peeling |
|  | 2 | No peeling |
|  | 3 | No peeling |
| Comparative Example | 2 | Peeling |

In the above embodiments, although the hard film was applied to the piston ring, the hard film is not limited to piston ring applications. The hard film can be effectively applied to cover at least the sliding surface of other sliding members such as tappets and cams used as a valve driving member in internal combustion engines.

Although the present invention has been described with reference to the preferred embodiments, it is apparent that the present invention is not limited to the aforesaid preferred embodiments, but various modification can be attained without departing from its scope.

What is claimed is:

1. A hard film having a crystal structure comprised of mixed phases of CrN and TiN, and containing at least one selected from oxygen and carbon in a solid solution state in the CrN and TiN crystals, and having a crystal particle size of less than 1 μm, and having one of any of the following compositions:

(a) chromium of 40 to 75 percent by weight, titanium of 10 to 40 percent by weight, oxygen of 0.5 to 15 percent by weight and the remainder of nitrogen;

(b) chromium of 40 to 75 percent by weight, titanium of 10 to 40 percent by weight, carbon of 0.5 to 10 percent by weight and the remainder of nitrogen;

(c) chromium of 40 to 75 percent by weight, titanium of 10 to 40 percent by weight, oxygen of 0.5 to 15 percent by weight, carbon of 0.5 to 10 percent by weight, the total content of oxygen and carbon within 20 percent by weight and the remainder of nitrogen.

2. A hard film as claimed in claim 1, wherein said hard film has a Vickers hardness in a range from 1300 to 2300.

3. A sliding member covered on at least a sliding surface of said sliding member with said hard film as claimed in claim 1.

4. A sliding member as claimed in claim 3, wherein said sliding member is a piston ring.

5. A sliding member as claimed in claim 3, wherein an under film of CrN not substantially containing oxygen and carbon in a solid solution state is formed beneath said hard film.

6. A sliding member as claimed in claim 3, wherein the crystals of CrN and TiN have a preferred orientation of (200) surface or preferred orientation of (111) surface parallel to a surface being covered.

7. A sliding member as claimed in claim 3, wherein the crystals of CrN and TiN have a columnar structure developing in a columnar shape from the base material toward the film surface.

8. A sliding member as claimed in claim 3, wherein the thickness of said hard film is in a range from 1 to 100 μm.

9. A manufacturing method for a sliding member covered by ion plating on at least a sliding surface of said sliding member with said hard film as claimed in claim 1.

* * * * *